United States Patent
Ali et al.

(10) Patent No.: US 11,490,535 B2
(45) Date of Patent: Nov. 1, 2022

(54) IN-MOLD ELECTRONICS WITHIN A ROBOTIC DEVICE

(71) Applicant: Honda Motor Co., Ltd., Tokyo (JP)

(72) Inventors: Zainab I. Ali, Marysville, OH (US); Alex W. Baker, Ostrander, OH (US)

(73) Assignee: HONDA MOTOR CO., LTD., Tokyo (JP)

( * ) Notice: Subject to any disclaimer, the term of this patent is extended or adjusted under 35 U.S.C. 154(b) by 479 days.

(21) Appl. No.: 16/591,148

(22) Filed: Oct. 2, 2019

(65) Prior Publication Data

US 2021/0105904 A1  Apr. 8, 2021

(51) Int. Cl.
| | |
|---|---|
| *H05K 5/03* | (2006.01) |
| *H05K 5/02* | (2006.01) |
| *B29C 45/14* | (2006.01) |
| *B29C 51/14* | (2006.01) |
| *H05B 47/10* | (2020.01) |

(52) U.S. Cl.
CPC ......... *H05K 5/03* (2013.01); *B29C 45/14639* (2013.01); *B29C 45/14811* (2013.01); *B29C 51/14* (2013.01); *H05B 47/10* (2020.01); *H05K 5/0252* (2013.01)

(58) Field of Classification Search
CPC ...................................................... H05K 5/00
See application file for complete search history.

(56) References Cited

U.S. PATENT DOCUMENTS

| | | | |
|---|---|---|---|
| 5,461,256 A | * | 10/1995 | Yamada ........... G06K 19/07745 257/679 |
| 6,139,304 A | | 10/2000 | Centofante |
| 6,287,164 B1 | | 9/2001 | Radloff |
| 6,897,390 B2 | | 5/2005 | Caldwell et al. |
| 7,401,758 B2 | | 7/2008 | Liang et al. |
| 7,862,220 B2 | | 1/2011 | Cannon et al. |
| 8,514,545 B2 | | 8/2013 | Haag |
| 9,297,675 B2 | | 3/2016 | Keränen et al. |
| 9,420,741 B2 | | 8/2016 | Balutis et al. |
| 9,471,063 B2 | | 10/2016 | Ouyang |
| 10,031,527 B2 | | 7/2018 | Björn |

(Continued)

OTHER PUBLICATIONS

Sherman, "Finnish Startup Gets IMSE Lighting Patent" Plastics Technology. https://www.ptonline.com/blog/post/finnish-startup-gets-in-mold-structural-electronics-imse-lighting-patent (Sep. 20, 2016).

*Primary Examiner* — Jerry Wu
(74) *Attorney, Agent, or Firm* — Rankin Hill & Clark LLP (57) ABSTRACT

A robotic device having in-mold electronics is provided. According to one or more aspects, a robotic device includes an electronic computing unit for controlling the robotic device and a molded part. The molded part includes a thermoformed first film, structural layer, electronic circuit, and a functional component. The molded structural layer is arranged under the first film. The thermoformed second film arranged under the structural layer. The electronic circuit arranged over the second film and adjacent the structural layer. The electronic circuit includes a functional component communicably coupled to the electronic computing unit. The first film is arranged to cover the structural layer, the second film, and the electronic circuit to define an exposed surface of the molded part.

5 Claims, 6 Drawing Sheets

(56) References Cited

U.S. PATENT DOCUMENTS

| | | | |
|---|---|---|---|
| 2009/0021529 A1* | 1/2009 | Wendler | H05K 3/368 345/619 |
| 2015/0022994 A1 | 1/2015 | Bingle | |
| 2017/0190083 A1 | 7/2017 | Zhou et al. | |
| 2019/0165019 A1* | 5/2019 | Wang | H01L 27/14634 |

* cited by examiner

IN-MOLD ELECTRONICS WITHIN A ROBOTIC DEVICE

BACKGROUND

Molded parts are used as for robotic devices. However, these molded parts often do not have any functionality. To impart functionality to the molded parts, a functional component may be affixed to a molded part. The molded part may require a rather complex structure for accommodating the functional component so as to conceal the functional component from view and protect it from impact. The complexity of the structures can be further exacerbated by environmental factors that the functional component is exposed to. The complex structure for affixing the functional component to the robotic device may include a number of components to that provide waterproofing for the functional component against moisture such as rain, fog, dew, etc. The complex structure may also protect the functional component from other aspects of the environment of the robotic device, such as the terrain. However, these structures may add weight and bulk to the robotic devices.

BRIEF DESCRIPTION

According to one aspect, a robotic device including an electronic computing unit for controlling the robotic device and a molded part. The molded part includes a thermoformed first film, structural layer, electronic circuit, and a functional component. The molded structural layer is arranged under the first film. The thermoformed second film arranged under the structural layer. The electronic circuit arranged over the second film and adjacent the structural layer. The electronic circuit includes a functional component communicably coupled to the electronic computing unit. The first film is arranged to cover the structural layer, the second film, and the electronic circuit to define an exposed surface of the molded part.

According to one aspect, a robotic device including an electronic computing unit for controlling the robotic device and a molded part. The electronic computing unit includes a processor for processing sensor data from at least one functional component. The molded part includes a thermoformed first film, structural layer, electronic circuit, and a functional component. The molded structural layer is arranged under the first film. The thermoformed second film arranged under the structural layer. The electronic circuit arranged over the second film and adjacent the structural layer. The electronic circuit includes the at least one functional component communicably coupled to the electronic computing unit. The first film is arranged to cover the structural layer, the second film, and the electronic circuit to define an exposed surface of the molded part.

According to another aspect, method of producing a molded part of a robotic device includes providing a first thermoformable film and a thermoformed second film. The method further includes arranging a plurality of functional components on the second film. In some embodiments, a structural layer may be arranged between the first thermoformable film and the plurality of functional components. The method further includes arranging the first thermoformable film, the plurality of functional components, and the thermoformed second film. The method also includes injecting resin into the mold to form an exposed surface of the robotic device.

DETAILED DESCRIPTION

As discussed above, adding functional components to robotic devices can add size, weight, and moving parts to robotic devices, which can make the robotic devices unwieldly and fragile. Generally, the systems and method disclosed herein are directed to a robotic device having a molded part with an in-mold functional component. By using in-mold functional components, the robotic device does not suffer the additional weight and bulk of structures used to affix functional components to the molded part of the robotic device. Accordingly, the functional components may be formed with the molded part of the robotic device such that the functional parts are embedded within the robotic device. For example, the functional components may be formed with the molded part of the robotic device using injection molding techniques. In addition to not requiring unwieldly structures for affixing the functional components, the functional parts are protected due to the functional components being formed with the molded part and thus embedded in the robotic device. Accordingly, additional components are not required to waterproof, protect, etc. the functional components. Furthermore, because the functional components are in-molded, the robotic device has fewer moving parts. Thus, the robotic devices can be utilized for more difficult operations and/or be used in more hostile environments.

Definitions

The following includes definitions of selected terms employed herein. The definitions include various examples and/or forms of components that fall within the scope of a term and that can be used for implementation. The examples are not intended to be limiting.

A "bus," as used herein, refers to an interconnected architecture that is operably connected to other computer components inside a computer or between computers. The bus can transfer data between the computer components. The bus can be a memory bus, a memory controller, a peripheral bus, an external bus, a crossbar switch, and/or a local bus, among others. The bus can also be a vehicle bus that interconnects components inside a vehicle using protocols such as Media Oriented Systems Transport (MOST), Controller Area network (CAN), Local Interconnect Network (LIN), among others.

"Computer communication," as used herein, refers to a communication between two or more computing devices (e.g., computer, personal digital assistant, cellular telephone, network device) and can be, for example, a network transfer, a file transfer, an applet transfer, an email, a hypertext transfer protocol (HTTP) transfer, and so on. A computer communication can occur across, for example, a wireless system (e.g., IEEE 802.11), an Ethernet system (e.g., IEEE 802.3), a token ring system (e.g., IEEE 802.5), a local area network (LAN), a wide area network (WAN), cloud computing communication, a point-to-point system, a circuit switching system, a packet switching system, among others.

"Computer-readable medium," as used herein, refers to a non-transitory medium that stores instructions and/or data. A computer-readable medium can take forms, including, but not limited to, non-volatile media, and volatile media. Non-volatile media can include, for example, optical disks, magnetic disks, and so on. Volatile media can include, for example, semiconductor memories, dynamic memory, and so on. Common forms of a computer-readable medium can include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other robotic device can read.

A "database," as used herein can refer to table, a set of tables, a set of data stores and/or methods for accessing and/or manipulating those data stores. Some databases can be incorporated with a disk as defined above.

A "device system," as used herein can include, but is not limited to, any automatic or manual systems that can be used to enhance the mobility, planning, and/or safety. Exemplary device systems include, but are not limited to: an electronic stability control system, boundary monitoring system, an anti-lock brake system, a brake assist system, an automatic brake prefill system, a low speed follow system, a cruise control system, a collision warning system, a collision mitigation braking system, an auto cruise control system, a lane departure warning system, a blind spot indicator system, a lane keep assist system, a navigation system, a transmission system, brake pedal systems, an electronic power steering system, visual devices (e.g., camera systems, proximity sensor systems), a climate control system, an electronic pretensioning system, a monitoring system, a passenger detection system, a vehicle suspension system, a vehicle seat configuration system, a vehicle cabin lighting system, an audio system, a sensory system, among others.

A "disk," as used herein can be, for example, a magnetic disk drive, a solid state disk drive, a floppy disk drive, a tape drive, a Zip drive, a flash memory card, and/or a memory stick. Furthermore, the disk can be a CD-ROM (compact disk ROM), a CD recordable drive (CD-R drive), a CD rewritable drive (CD-RW drive), and/or a digital video ROM drive (DVD ROM). The disk can store an operating system that controls or allocates resources of a computing device.

"Logic circuitry," as used herein, includes, but is not limited to, hardware, firmware, a non-transitory computer readable medium that stores instructions, instructions in execution on a machine, and/or to cause (e.g., execute) an action(s) from another logic circuitry, module, method and/ or system. Logic circuitry can include and/or be a part of a processor controlled by an algorithm, a discrete logic (e.g., ASIC), an analog circuit, a digital circuit, a programmed logic device, a memory device containing instructions, and so on. Logic can include one or more gates, combinations of gates, or other circuit components. Where multiple logics are described, it can be possible to incorporate the multiple logics into one physical logic. Similarly, where a single logic is described, it can be possible to distribute that single logic between multiple physical logics.

A "memory," as used herein can include volatile memory and/or non-volatile memory. Non-volatile memory can include, for example, ROM (read only memory), PROM (programmable read only memory), EPROM (erasable PROM), and EEPROM (electrically erasable PROM). Volatile memory can include, for example, RAM (random access memory), synchronous RAM (SRAM), dynamic RAM (DRAM), synchronous DRAM (SDRAM), double data rate SDRAM (DDR SDRAM), and direct RAM bus RAM (DR-RAM). The memory can store an operating system that controls or allocates resources of a computing device.

A "module," as used herein, includes, but is not limited to, non-transitory computer readable medium that stores instructions, instructions in execution on a machine, hardware, firmware, software in execution on a machine, and/or combinations of each to perform a function(s) or an action (s), and/or to cause a function or action from another module, method, and/or system. A module may also include logic, a software controlled microprocessor, a discrete logic circuit, an analog circuit, a digital circuit, a programmed logic device, a memory device containing executing instructions, logic gates, a combination of gates, and/or other circuit components. Multiple modules may be combined into one module and single modules may be distributed among multiple modules.

An "operable connection," or a connection by which entities are "operably connected," is one in which signals, physical communications, and/or logical communications can be sent and/or received. An operable connection can include a wireless interface (e.g., for wireless charging), a physical interface, a data interface, and/or an electrical interface.

A "portable device," as used herein, is a computing device typically having a display screen with user input (e.g., touch, keyboard) and a processor for computing. Portable devices include, but are not limited to, handheld devices, mobile devices, smart phones, laptops, tablets, e-readers, smart speakers. In some embodiments, a "portable device" could refer to a remote device that includes a processor for computing and/or a communication interface for receiving and transmitting data remotely.

A "processor," as used herein, processes signals and performs general computing and arithmetic functions. Signals processed by the processor can include digital signals, data signals, computer instructions, processor instructions, messages, a bit, a bit stream, or other means that can be received, transmitted and/or detected. Generally, the processor can be a variety of various processors including multiple single and multicore processors and co-processors and other multiple single and multicore processor and co-processor architectures. The processor can include various modules to execute various functions.

"Robotic device," as used herein, is any electronic device capable of some degree of autonomous mobility. Exemplary robotic devices can include, but are not limited to self-propelled lawn mowers, self-propelled vacuum cleaners, manual self-propelled wheelchairs, powered wheelchairs, scooters, bicycles, carts, and strollers. The robotic device may also be a vehicle capable of carrying one or more human occupants, cargo, conveyance device, etc., powered by any form of energy. In some embodiments, the robotic device can include various sensors for sensing and determining various parameters of the environment. For example, location, weather conditions, and travel parameters, among others. Some robotic devices have user input and output functionality.

"Value" and "level", as used herein can include, but is not limited to, a numerical or other kind of value or level such as a percentage, a non-numerical value, a discrete state, a discrete value, a continuous value, among others. The term "value of X" or "level of X" as used throughout this detailed description and in the claims refers to any numerical or other kind of value for distinguishing between two or more states of X. For example, in some cases, the value or level of X may be given as a percentage between 0% and 100%. In other cases, the value or level of X could be a value in the range between 1 and 10. In still other cases, the value or level of X may not be a numerical value, but could be associated with a given discrete state, such as "not X", "slightly x", "x", "very x" and "extremely x".

System Overview

Figure 1:
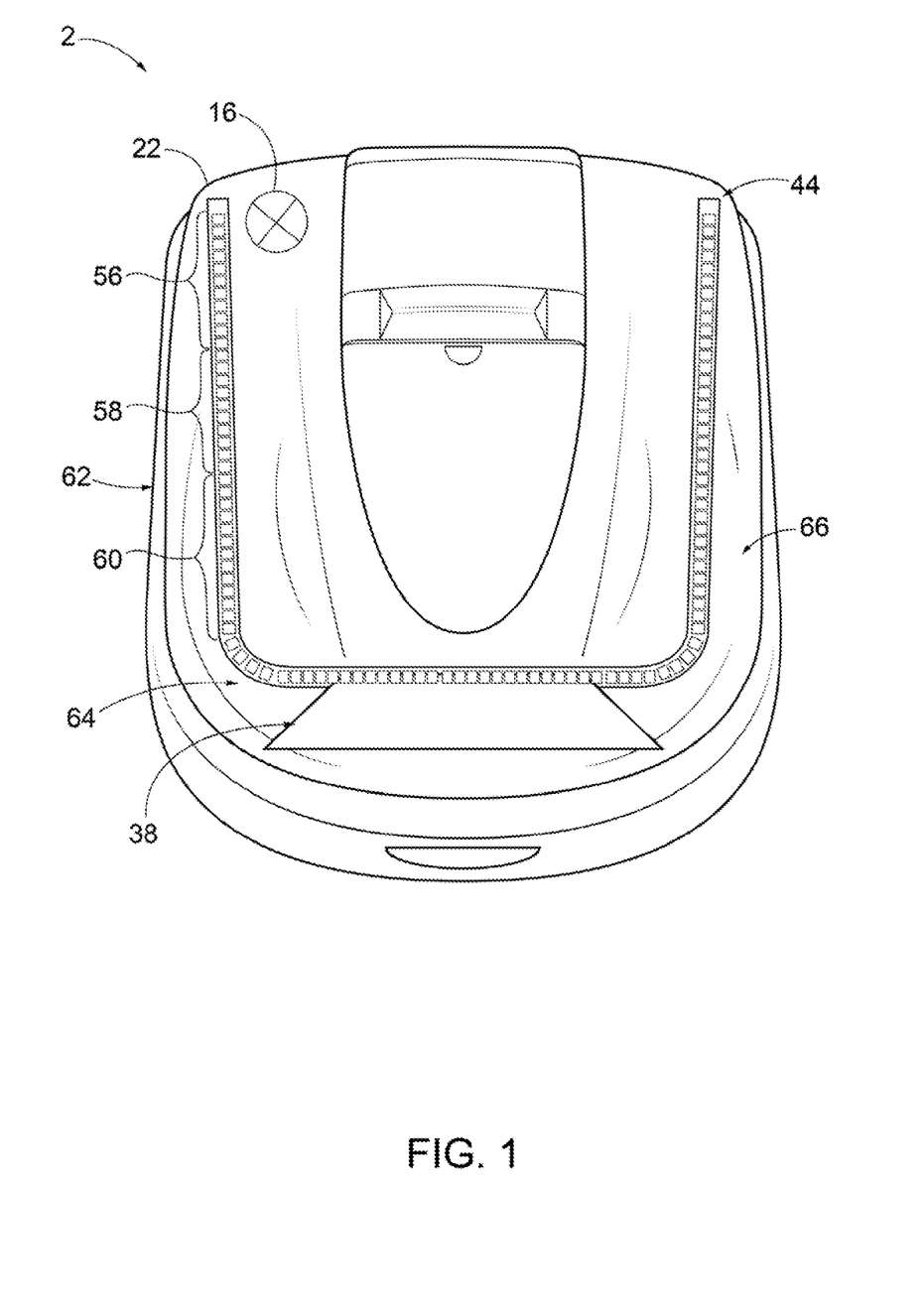
FIG. 1 is a robotic device having in-mold functional components according to an exemplary embodiment.
Figure 2:
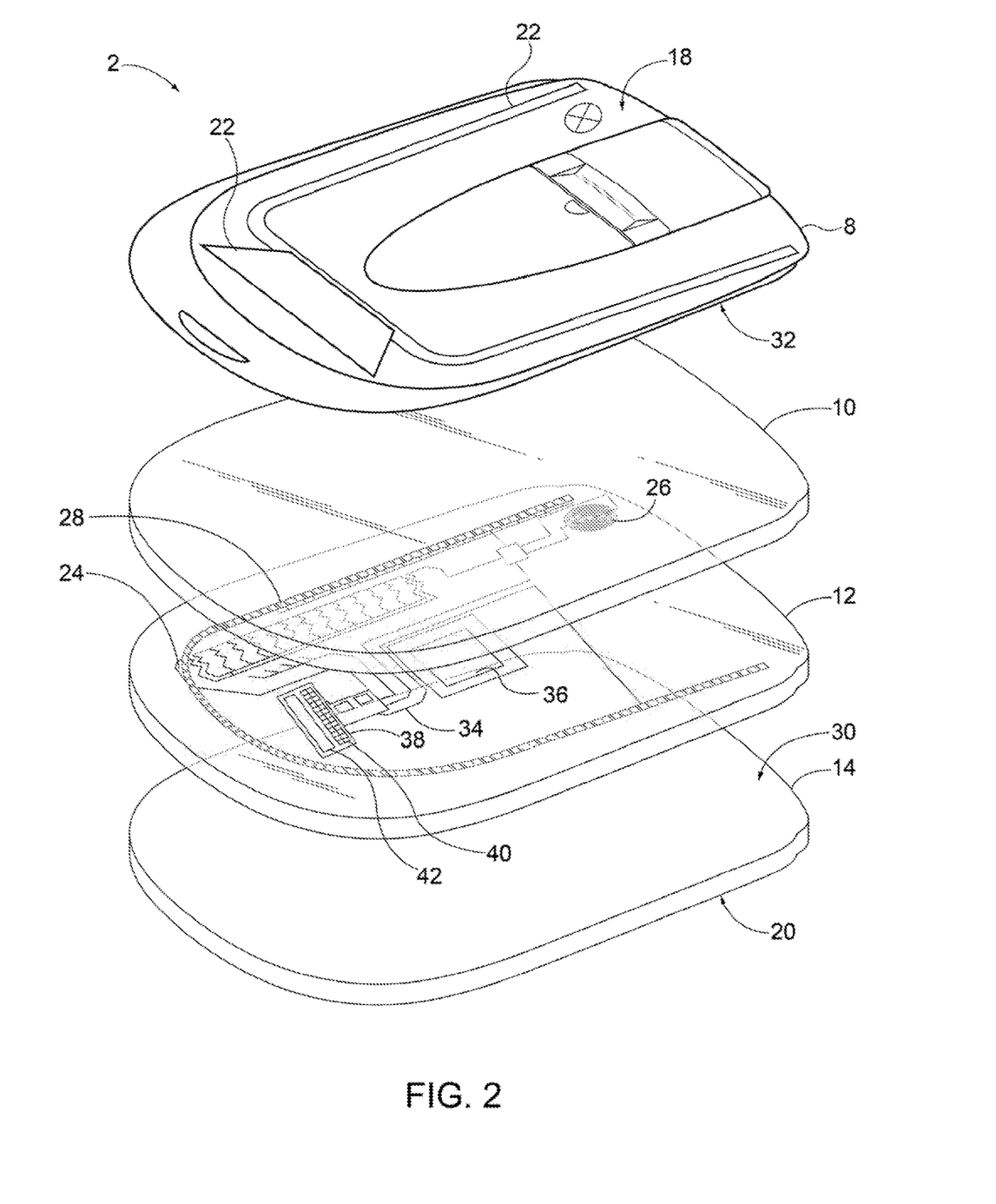
FIG. 2 is an exploded perspective view of a robotic device having in-mold functional components according to an exemplary embodiment.

Referring now to the drawings, wherein the showings are for purposes of illustrating one or more exemplary embodiments and not for purposes of limiting same, FIGS. 1 and 2 illustrate a robotic device 2 having in-mold functional components. The robotic device 2 includes a molded part 4 and an electronic computing unit 6. The molded part 4 includes a first film 8, a molded polymeric structural layer 10, and an in-molded printed electronic circuit 12. The molded part 4 optionally includes second film 14 and graphics 16 on an exposed surface 18 of the robotic device 2.

The first film 8 and the second film 14 may each be thermoformable, and may include the same or different materials. The first film 8 and the second film 14 may each include a flat thin-gauged thermoplastic polymer sheet that can be heated to a pliable forming temperature, formed to a specific shape (e.g. in a mold), and cooled to retain the specific shape. The first film 8 and the second film 14 may each include acrylic, acrylonitrile butadiene styrene, nylon, polylactic acid, polybenzimidazoles, polycarbonate, polysulfone, polyoxymethylene, polyetherether ketone, polyetherimides, polyvinyl chloride, polyethylene, polyphenylene oxide, polyphenylene sulfide, polypropylene, polystyrene, polytetrafluoroethylene, other thermoplastics, or combinations thereof. Before being thermoformed, the first film 8 and the second film 14, may each have a gauge of less than 1.5 mm. At these gauges, the first film 8 and the second film 14 are not considered structural films in that they may not support their own shape or the shape of the molded part 4 before or after thermoforming, and instead may bend or otherwise deform when unsupported by the structural layer 10.

The first film 8 is arranged to cover the other components of the molded part 4 (including the circuit 12), and may therefore define an exposed surface 18 of the molded part 4 and the robotic device 2. The exposed surface 18 may be the outermost surface of the robotic device 2 that is most visible while the non-exposed surface 20 is not generally visible. For example, suppose that the robotic device 2 is a robotic lawnmower. The exposed surface 18 may be visible during mowing operations while blades (not shown) may cut grass through an opening in the non-exposed surface 20.

Figure 3:
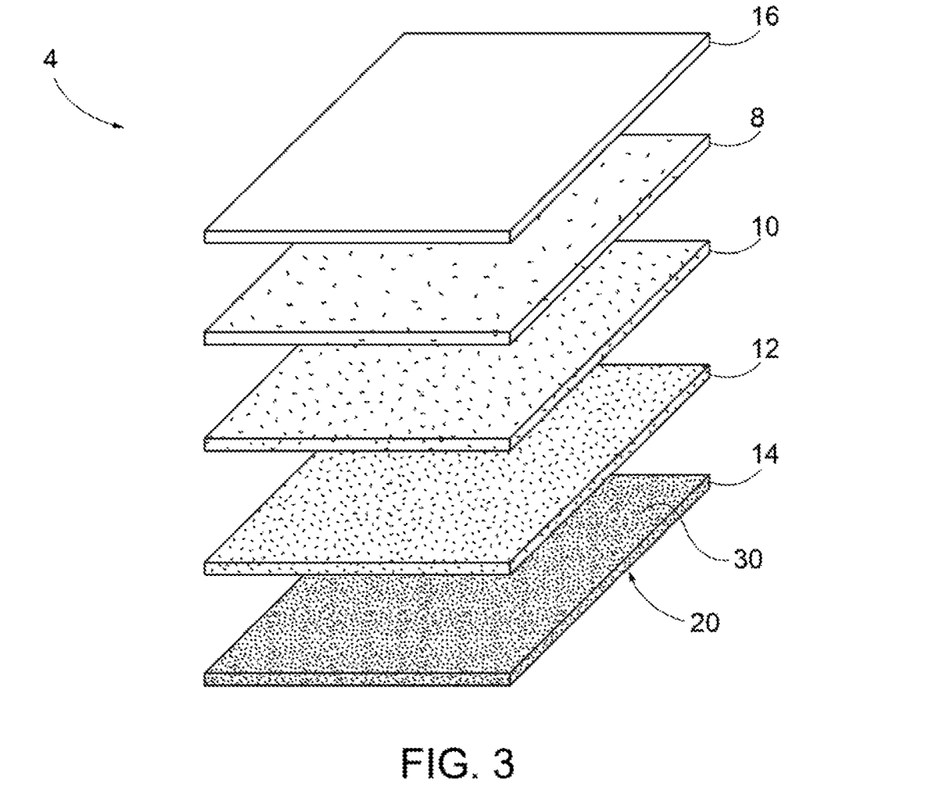
FIG. 3 is a schematic exploded perspective view of a portion of a molded part before a molding process according to an exemplary embodiment.
Figure 4:
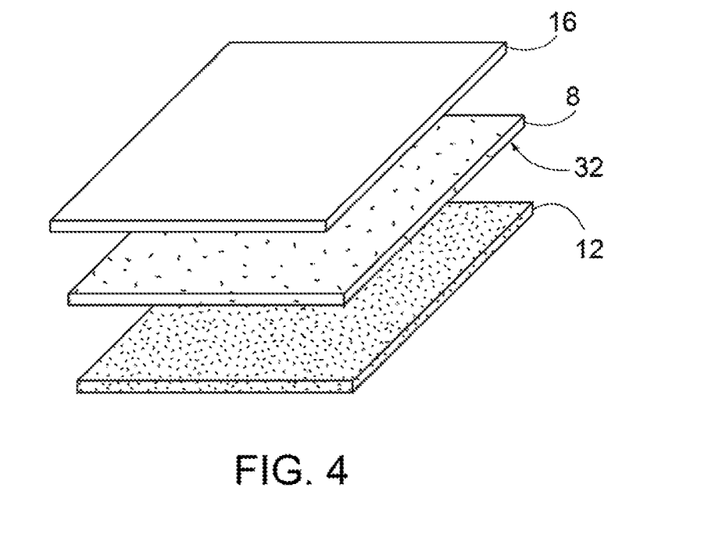
FIG. 4 is a schematic exploded perspective view of a portion of a molded part before a molding process according to an exemplary embodiment.

The first film 8 may act as a substrate upon which the electronic circuit 12 is printed as shown in FIGS. 2-4. The first film 8 may be initially flat, and then be made contoured as a result of being thermoformed/molded. As seen in FIGS. 1 and 2, the first film 8 may include viewing features 22 that allow viewing through the first film 8 from the exposed surface 18. Such viewing features 22 may be apertures, thinned areas, or other features in the first film 8 that allows viewing through the first film 8.

If the second film 14 is included in the robotic device 2, the second film 14 may be arranged under the other components of the molded part 4, and may define a non-exposed surface 20 of the molded part 4 that is on a side of the molded part 4 opposite from the exposed surface 18. The non-exposed surface 20 may be the innermost surface of the of the molded part 4 that is least visible or not visible at all when the robotic device 2 is included as a component of the vehicle. The second film 14 may be provided as a substrate upon which the electronic circuit 12 is printed. If the second film 14 is not included in the molded part 4, the first film 8 may act as a substrate upon which the electronic circuit 12 is printed. The second film 14 may be initially flat, and then be made contoured as a result of thermoforming/molding.

The structural layer 10 is provided as a structural support for the other components of the molded part 4 and robotic device 2, in order to maintain a shape of the robotic device 2. The structural layer 10 is arranged under, and is covered by, the first film 8, and may be arranged over, and thus covering, the second film 14 if included. The structural layer 10 is arranged adjacent to, and may contact, the circuit 12. In FIGS. 2 and 4, the structural layer 10 is arranged over the circuit 12 and second film 14, and as such, the structural layer 10 may be transparent.

Figure 5:
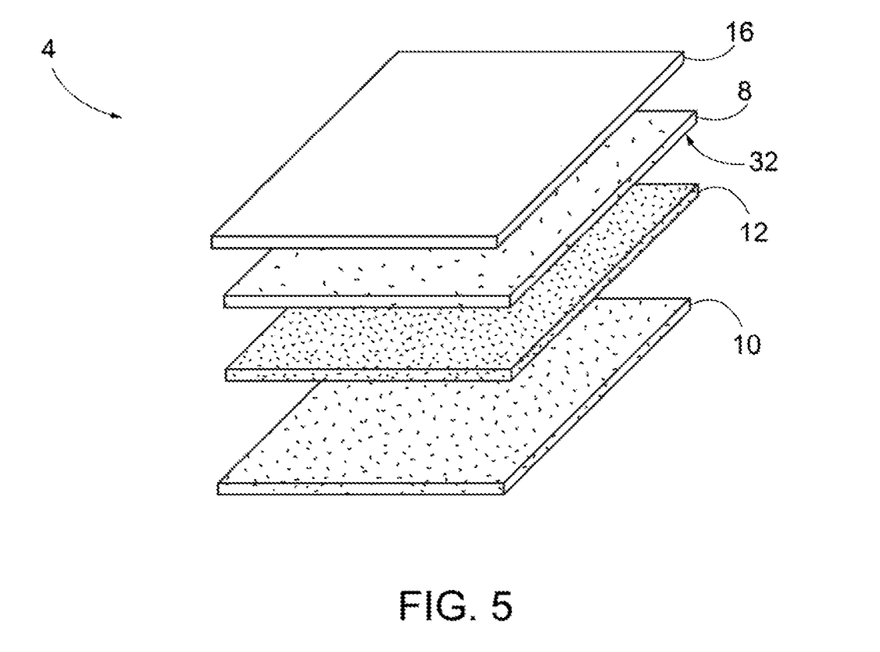
FIG. 5 is a schematic exploded perspective view of portion of a molded part before a molding process according to an exemplary embodiment.

In FIG. 5, the structural layer 10 is arranged under the circuit 12 and no second film 14 is included. The structural layer 10 may have a thickness of more than 3 mm in order to provide structural support for the molded part 4. At these thicknesses, the structural layer 10 may be able maintain its own shape, even if not supported by other components or material, and may be able maintain the shape of the other components of the robotic device 2.

The structural layer 10 may include a molded polymer that is formed by curing a resin material. The polymer may include a variety of thermoplastics, thermosets, or combinations thereof. The structural layer 10 may include other materials such as fillers, reinforcements (e.g. fibers of glass or aramid), other additional layers, etc., or combinations thereof. In a non-limiting embodiment, the structural layer 10 includes a thermoplastic polymer that is cured by cooling a molten resin material. The structural layer 10 may be coextensive with the first film 8 and/or the second film 14.

The electronic circuit 12 is included to provide functionality to the robotic device 2. The circuit includes one or more flexible conductive traces 24, a communications antenna 26 electrically connected to the traces 24, and one or more light sources 28 electrically connected to the traces 24. Although the circuit 12 is depicted in the figures as being a continuous layer, this is only for convenience in order to show the arrangement of the various elements of the molded part 4, and it will be understood that the circuit 12 may or may not comprise voids between conductive traces 24, the communications antenna 26, and the light sources 28, and therefore the circuit 12 may or may not be a continuous layer as depicted.

The circuit 12 may be printed on the top surface 30 of the second film 14 or on a bottom surface 32 of the first film 8. The circuit 12 includes the functional components such as the conductive traces 24, the communications antenna 26, the light sources 28, and the sensor 36. The circuit 12 may be flexible and therefore may conform to the contours of the thermoformed first film 8 and the second film 14. By "flexible", it is meant a layer, circuit, trace or other element or material that is not rigid, brittle, or stiff, and instead bends, stretches, changes shape, or otherwise yields to external forces, yet does not break or lose functionality when subject to such external forces. When referring to the "flexible electronic circuit," the electronic circuit 12 does not break and retains its conductivity even when bent, stretched, twisted or otherwise deformed to a strain of 1% to at least 35%.

In one embodiment, the molded part 4 includes only one electronic circuit 12. In another embodiment, the molded part 4 includes more than one electronic circuit 12, for example, two, three or more electronic circuits 12. When more than one circuit 12 is included in the molded part 4, each circuit 12 may be configured to perform a different function than the other circuits 12, which may mean that each circuit 12 is electrically isolated/separated from the other circuits 12, or the circuits 12 can be independently operated, or each circuit 12 can function separately from the other circuits 12, or the circuits 12 are electrically connected to different types of functional elements. The functional elements may be printed on the circuits in a single layer and/or on a single film.

Figure 6:
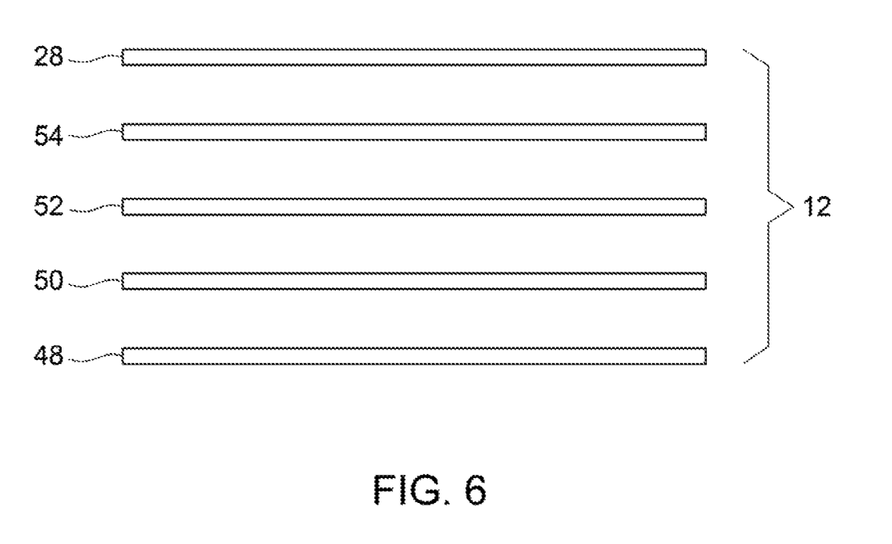
FIG. 6 is a schematic exploded side view of a printed circuit according to an exemplary embodiment.

As depicted in FIG. 6, the circuit 12 may formed with application of a graphic ink layer 48, a conductive ink layer 50, a dielectric ink layer 52, a conductive adhesive layer 54, and the light sources 28. The graphic ink layer 48 may be included to provide a desired visual appearance to the robotic device 2, for example, a part of the circuit 12 that may be visible through the viewing features 22. The conductive ink layer 50 may be used to form the conductive traces 24. The dielectric ink layer 52 may be used to insulate the conductive traces 24. The conductive adhesive layer 54 may be used to adhere and electrically connect various functional components to the conductive traces 24, such as communications antenna 26, light sources 28, or other pick-and-place surface mounted electronic elements that are not printed electronic elements, for example. The circuit 12 includes a communications antenna 26 and a printed circuit board (PCB) 34, both of which may be flexible. The communications antenna 26 may be communicably coupled to the electronic computing unit 6.

Figure 7:
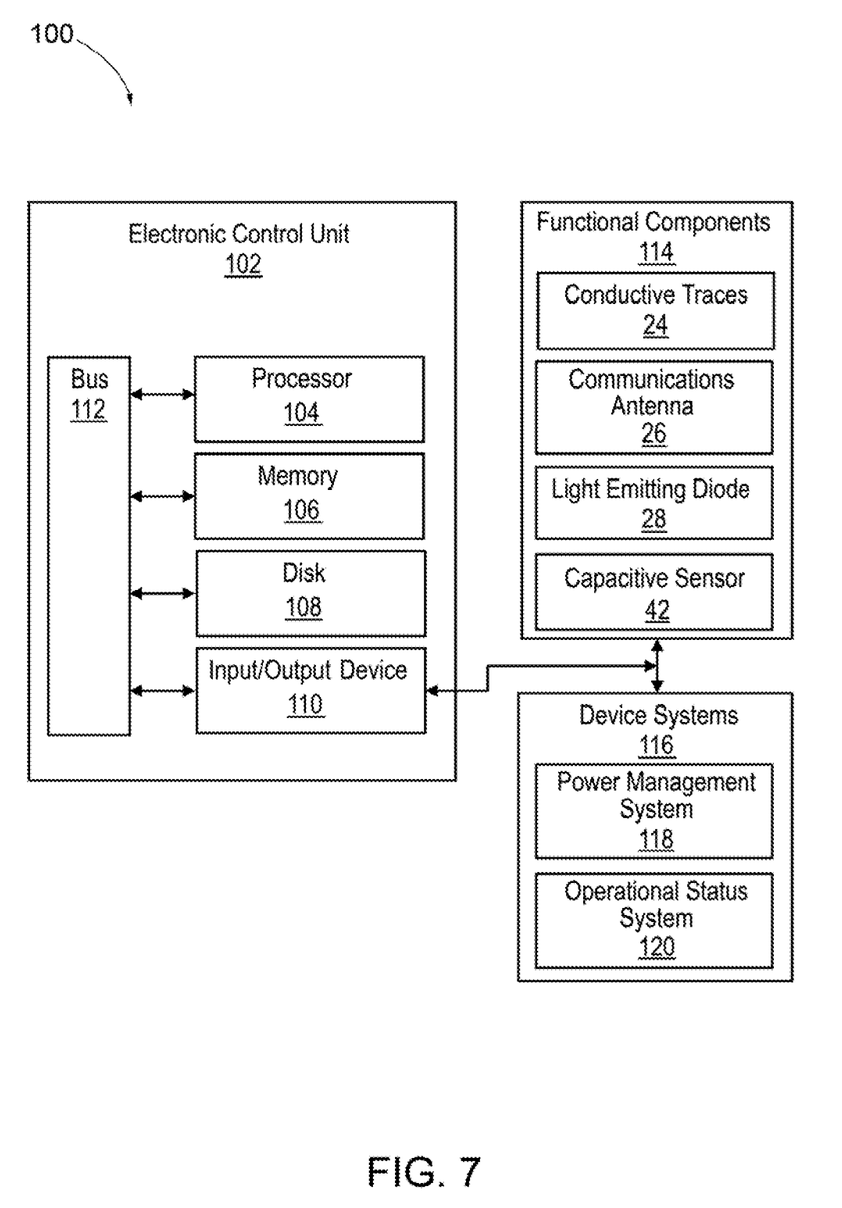
FIG. 7 is a schematic diagram of an operating environment for implementing systems and methods for utilizing a robotic device having a functional component according to an exemplary embodiment.

Turning to FIG. 7, the electronic computing unit 6 of the robotic device 2 with provisions for processing, communicating, and interacting with various components of the robotic device 2. The components and functions of the electronic computing unit 6 can be implemented remotely from the robotic device 2, for example, with a portable device or another device connected via a network (not shown).

Generally, the electronic computing unit 6 includes a processor 104, a memory 106, a disk 108, and an input/output (I/O) interface 110, which are each operably connected for computer communication via a bus 112 and/or other wired and wireless technologies. The I/O interface 110 provides software and hardware to facilitate data input and output between the components of the electronic computing unit 6 and other components, networks, and data sources, which will be described herein. Additionally, the processor 104 may include modules and/or logic circuitry for operating the robotic device 2.

The electronic computing unit 6 is also operably connected for computer communication (e.g., via the bus 112 and/or the I/O interface 110) to one or more functional components 114 such the conductive traces 24, such as communications antenna 26, light source 28, the sensor 36 or other pick-and-place surface mounted electronic elements that are not printed electronic elements, for example. The electronic computing unit 6 may also be operably connected to device systems 116 can include, but are not limited to, any automatic or manual systems that can be used to enhance the robotic device 2, driving, and/or safety. The functional components 114 and/or the from which this data or these signals are derived, or to which this data or these signals are communicated, are not particularly limited and may include one or more vehicle electronic computing units (ECU's) associated with the robotic device 2. The device systems 116 can include a door control unit, engine control unit, electric power steering control unit, human-machine interface (HMI), powertrain control module, transmission control unit; seat control unit, speed control unit, telematics control unit, transmission control unit, brake control module (ABS or ESC), battery management system, central control module, central timing module, general electronic module, body control module, suspension control module, or combinations thereof.

As discussed above, the device systems 116 include and/or are operably connected for computer communication to the functional components 114. The functional components 114 provide and/or sense information associated with the robotic device 2, the environment, the device systems 116, etc. The functional components 114 can include, but are not limited to, environmental sensors, speed sensors, brake sensors, throttle position sensors, wheel sensors, anti-lock brake sensors, among others. In some embodiments, the functional components 114 are incorporated with the device systems 116. For example, the functional components 114 may include external cameras, radar and laser sensors to detect the presence of an object. Additionally, the functional components 114 may detect characteristics of the object, such as location and speed of the object, as well as relative characteristics of the robotic device 2 and the object, such as relative distance and speed between the robotic device 2 and the object.

Accordingly, the functional components 114 are operable to sense a measurement of data associated with the robotic device 2, the vehicle environment, and the device systems 116, and generate a data signal indicating said measurement of data. These data signals can be converted into other data formats (e.g., numerical value) and/or used by the device systems 116 and/or the electronic computing unit 6 to generate other data metrics, values, and/or parameters. It is understood that the functional components 114 can be any type of sensor, for example, acoustic, electric, environmental, optical, imaging, light, pressure, force, thermal, temperature, proximity, among others.

The functional components 114 may additionally or alternatively include a light source, sensor, auxiliary power sources, capacitors, inductors, diodes, resistors, transformers, switches, other electrical loads, fuses, antennas, wireless transmitters, heaters, etc., each of which may be flexible. The functional components may also include a light source, sensor, auxiliary power sources, capacitors, inductors, diodes, resistors, transformers, switches, other electrical loads, fuses, antennas, wireless transmitters, heaters, etc., each of which may be flexible. However, it will be understood that these or other light sources 28 may be included in electrical communication with the circuits 12, but arranged elsewhere other than as part of the circuit 12. The light sources 28 may be a micro light emitting diode. The functional components 114 may be arranged in any possible configuration of the one or more electronic circuits 12.

The one or more electronic circuits 12 (including one or more conductive traces 24, the communications antenna 26, the light sources 28, and a capacitive sensor 42) may be formed using an electrically conductive ink that includes a binder (e.g. polymer material such as polyimide) and conductive particles, including for example, copper, ferromagnetic material, silver, carbon, silver chloride, or other electrically conductive particles. The one or more electronic circuits 12 may be formed by applying, e.g. printing, a conductive ink directly on the first film 8 and/or the second film 14, followed by curing, drying, hardening, etc. of the conductive ink. For example this method may be used to form the conductive traces 24, the communications antenna 26, the light sources 28, and a capacitive sensor 42 of the one or more electronic circuits 12. The conductive traces 24, the communications antenna 26, the light sources 28, and a capacitive sensor 42 may be defined by or include a printed and cured conductive ink. Numerous conductive inks are suitable to create the one or more electronic circuits 12 and/or the functional components 114, and may include, for example, Stretchable Conductors, Ink-Jet Silver Conductor, Ag Conductors, Stretchable Silver Conductors, and Ultra-Low Temperature Cure Silver Composite Conductors, among others.

These conductive inks can be applied on the first film 8 and/or second film 14 by any method including pad-printing, flexography, rotogravure, spraying, dipping, syringe dispensing, stenciling, screen printing, aerosol jet printing, or inkjet printing for example in order to create an electronic circuit. The flexible electronic circuits 12 can be formed using other materials or processes including etching, in-mold forming of the one or more electronic circuits 12, selective photocuring, and circuit scribe, for example. In one illustrative embodiment, the one or more electronic circuits 12 are formed by screen printing a conductive ink on the first film 8 and/or the second film 14 based on the arrangement of the functional elements. The conductive inks are applied on the first film 8 and/or second film 14 based on the arrangement of the functional components 114.

In an embodiment, graphics 16 may be arranged over the first film 8 on the exposed surface 18 of the robotic device 2 so as to be visible from the exposed surface 18. Although the graphics 16 are depicted in FIGS. 2-4 as being a continuous layer, this is simply for convenience, and it should be understood that the graphics 16 may or may not be a continuous layer. The graphics 16 and/or the first film 8, may at least partially conceal or camouflage the circuit 12 including the flexible conductive traces 24, the communications antenna 26, the light sources 28, and the PCB 34. The graphics 16 and/or the first film 8 may also conceal or camouflage the structural layer 10 and the second film 14. The graphics 16 are not particularly limited by the present subject matter, and may include a translucent or opaque layer, film, ink, or coating arranged over the flexible circuit 12. By "translucent" it is meant a material or layer that allows light to pass therethrough, but causes sufficient diffusion to prevent perception of distinct images through the material or layer. In another embodiment, the graphics 16 are not included, or the graphics 16 are clear (i.e. optically transparent) and/or the circuit 12 and light sources 28 thereof are positioned on top of the graphics 16.

In a non-limiting example, the graphics 16 and/or the first film 8 produce sufficient diffusion of light such that visibility through the graphics 16 and or first film 8, of the flexible electronic circuit 12 and all the light sources 28 of the circuit 12, except for light (L) emitted by the light source 28, is inhibited by the graphics 16 and/or first film 8. In one embodiment, the flexible electronic circuit 12 and all the light sources 28 of the circuit 12 may not be visible through the graphics 16 and/or first film 8. The light source 28 is also under the graphics 16 and the first film 8, and therefore visibility of the light source 28 through the graphics 16 and/or first film 8 may be inhibited by the graphics 16 and/or first film 8. In one embodiment, the light source 28 may not be visible through the graphics 16 and/or first film 8. However, the graphics 16 and/or first film 8 are sufficiently translucent (rather than being opaque) such that light emitted by the light source 28 is visible through the graphics 16 and/or first film 8. Accordingly, the graphics 16 and/or first film 8 at least in some measure conceals the flexible circuit 12 (including the light source 28) from view, yet allows light (L) emitted from the light source 28 to be transmitted therethrough so that the emitted light is visible through the graphics 16 and the first film 8. Light (L) emitted from the light source 28 that is transmitted through the graphics 16 and/or first film 8 may be used for illumination or as a visual indicator to convey information.

In one embodiment, the first film 8 includes viewing features 22 that allow viewing of the emitted light (L) from the light source 28. Such viewing features 22 may be arranged above the light source 28 to allow the emitted light (L) to be seen from the exposed surface 18. The first film 8 may be transparent, and thus allows emitted light (L) to be transmitted therethrough. In this aspect, the graphics 16 may not cover areas of the first film 8 above the light source 28 to thereby define the viewing features 22 and allow emitted light (L) to be seen from the exposed surface 18 through the viewing features 22.

The graphics 16 may be an ink, polymer, textile, composite material, enamel, paper, glass, metal, ceramic, other material, and combinations thereof. In one non-limiting example, the graphics 16 comprises a pigmented ink including for example a mixture of polymer and pigment particles. The polymer may be an acrylic urethane resin for example. The graphics 16 may be formed by applying the ink as a liquid over the first film 8 and curing the polymer in the ink to produce the graphics 16. The graphics 16 may have a pigment loading and/or thickness sufficient to inhibit or prevent the circuit 12 from being visible through the graphics 16. However, the graphics 16 may be sufficiently translucent, as opposed to being opaque, such that light (L) emitted by the light source 28 can be seen through the graphics 16. In one non-limiting embodiment, the graphics 16 have a thickness on the first film 8 from 5-50 µm, 15-40 µm, or 20-30 µm.

Operation of the robotic device 2, the electronic circuits 12, and the associated light sources 28, may correspond to signals or data derived from one or more of the device systems 116 of the robotic device 2 or may be continuously activated during operation of the robotic device 2. The data or signals may be accessed from, sensed by, generated by, or otherwise acquired from, or produced by, one or more of the vehicle electronic systems.

In an embodiment, the molded part 4 may include the printed circuit board ("PCB") 34 for controlling the supply of electric current from the communications antenna 26 to the light sources 28 via the conductive traces 24. The PCB 34 may be programed or may communicate via a wireless transmitter with the one or more electronic systems of the vehicle, which communication may be for determining when to provide electrical current to, and thus activate, the various light sources 28. The PCB 34 may also include a rectifier to convert alternating current from the communications antenna 26 to direct current delivered to the various light sources 28.

Further, the robotic device 2, the electronic circuits 12, and the associated light sources 28, may provide signals or data to the one or more electronic systems of the vehicle via the PCB 34. For example and as described in more detail herein, the robotic device 2 may include a sensor 36 and signals from the sensor 36 may be communicated to the vehicle electronic systems via the PCB 34, and these signals may be used to operate other light sources 28 in the robotic device 2 or to operate various operations of the vehicle. The sensor 36 is not particularly limited, and can include a sensor having any configuration including those that can sense pressure, movement, temperature, proximity, location, speed, velocity, acceleration, tilt, motion, humidity, ambient light, etc.

In another non-limiting example, the one or more electronic circuits 12 are in communication, via the PCB 34, with a human machine interface (HMI), which may be used to control functioning of the robotic device 2, the electronic circuits 12, and the associated light sources 28. Such arrangement could allow a user to provide input through the HMI to selectively activate the electronic circuits 12 and associated light sources 28. Such user input may be active (user initiated) or passive (sensed input from a user), and can include audible or tactile input. For example, the system may be configured to allow a user to audibly select operation of the robotic device 2, the electronic circuits 12, and the associated functional components 114.

For example, suppose that the robotic device 2 is a robotic lawn mower. The viewing features 22 may allow the light sources 28 to be visible though the first film 8. The light sources 28 may be arranged in relation to another electronic element, such as a sensor, so that light (L) emitted by the light sources 28 indicate a location and/or functioning of the robotic device 2. For example, the light sources 28 may be arranged in a U-shape 44 in a top view that includes a first longitudinal portion 62, a center portion 64, and a second longitudinal portion 66 that transition continuously without interruption. The first longitudinal portion 62 and the second longitudinal portion 66 extend in a longitudinal direction of the robotic device 2 in a top view.

The center portion 64 extends in a transverse direction of the robotic device 2 in a top view. The light sources 28 of the center portion 64 may be a portion of a detection system 38. Alternatively, light sources 40 of the detection system 38 may be separate from the light sources 28 such that the detection system 38 is flanked by the U-shape 44. In another embodiment, the center portion 64 may extend in a longitudinal direction to, at least partially, cover the detection system 38. The light sources 40 are similarly formed as function components 114 in the manner described above. The light sources 40 emit light through viewing features 22 of the first film 8. The detection system 38 may also include the capacitive sensor 42. The capacitive sensor 42 is configured to detect obstacles in the path of the robotic device 2. The device systems 116 may alter the path of the robotic device 2 based on the detection of the capacitive sensor 42.

In one embodiment, the first longitudinal portion 62 indicates an amount of battery power that the robotic lawn mower has left. For example, the viewing features 22 and/or light sources 28 may have a high portion 56 that is colored such that green light is emitted, a mid-portion 58 that is colored such that yellow light is emitted, a low portion 60 that is colored such that red light is emitted. The portion and/or the light sources 28 may be illuminated based on a power management system 118 the device systems 116. Accordingly, the processor 104 may send and receive data from the power management system 118, to cause a change to the first longitudinal portion 62. For example, the high portion 56 may be delluminated and the mid-portion 58 may be illuminated in response to data from the power management system 118. For example, the processor 104 may receive information about power management from the power management system 118 and effect a change to the functional components 114 of the robotic device 2.

The light sources 28 of the center portion 64 may also/alternatively emit light (L) to indicate that the sensor 36 has detected motion. Such detected motion may cause the sensor 36 to generate a signal, which can be transmitted to a vehicle system via a wireless communication transmitter in the printed circuit 12, in order to actuate the opening or closing of a door of the vehicle, or other function. In this manner, the functional components 114 may be actuated by the electronic control unit 102 based on information from the device systems 116 including one or more sensors.

The light sources 28 of the second longitudinal portion 66 may indicate a different operational status of the robotic device than the first longitudinal portion 62 and the center portion 64. The light sources 28 may illuminate differently based on the operational status. For example, the second longitudinal portion 66 may be illuminated continuously to indicate that the robotic device 2 is functioning properly, whereas the second longitudinal portion 66 may be illuminated in a flashing manner to indicate that the robotic device 2 requires maintenance. The pattern of the flashing may indicate different statuses, such as different forms of maintenance that are required. Additionally or alternatively, the light sources may change color or illuminate different portions of the second longitudinal portion 66 as described above with respect to the first longitudinal portion 62.

The center portion 64 may extend in a longitudinal direction to, at least partially, cover the detection system 38. The communications antenna 26 may be arranged adjacent a free end of the first longitudinal portion 62 and or the second longitudinal portion 66. The location of the communication antenna 26 may be demarcated by graphics 16.

Continuing the example from above and the robotic device 2 may be a robotic lawn mower. The device systems 116 may include a mowing module that includes a number of mowing pattern. The sensor 36 may monitor the progress of the robotic device 2 over the terrain. In one embodiment, the communications antenna 26 may communicate the progress of the robotic device 2 to a portable device (not shown). Accordingly, the functional components 114 are used to improve the functionality of the robotic device 2, and because the functional components 114 are in-molded, they improve the operation of the robotic device as the in-molded functional components 114 reduce the bulk, size, and number of moving parts of the robotic device 2.

Figure 8:
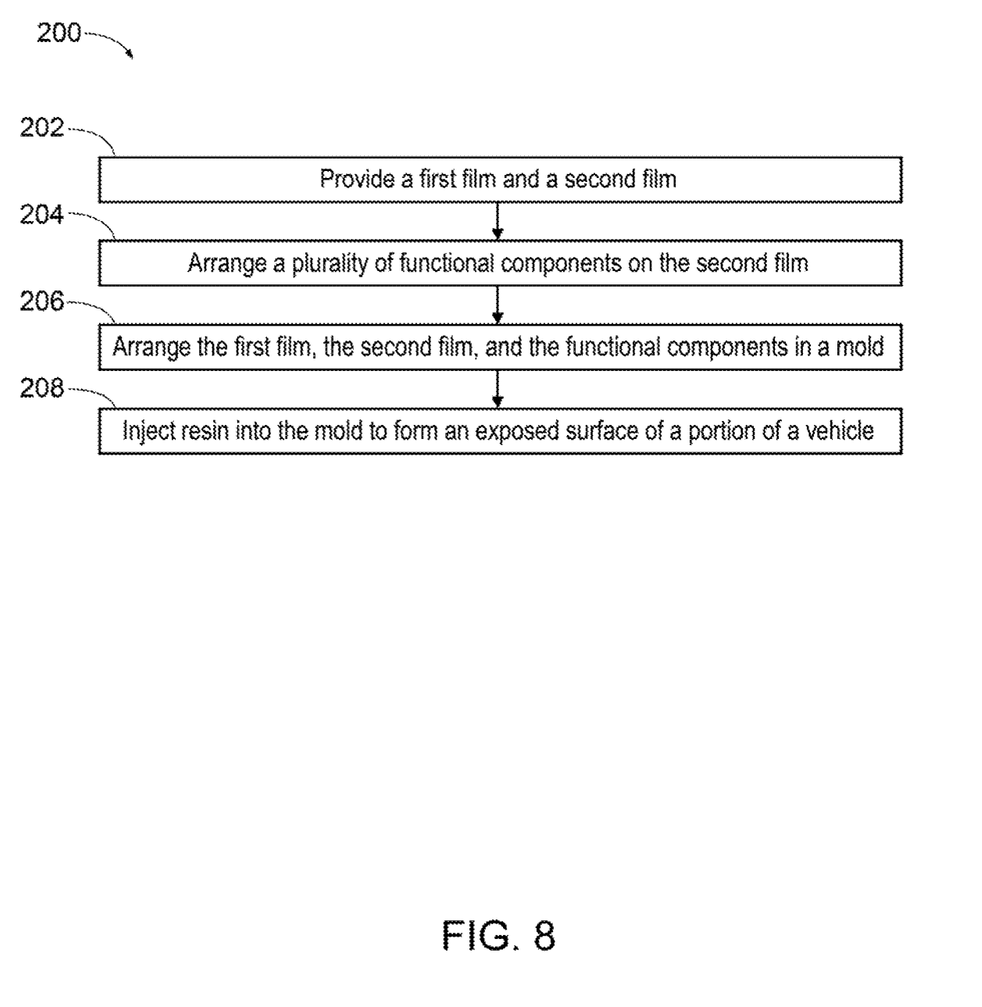
FIG. 8 is a process flow diagram of producing a molded part for an robotic device according to an exemplary embodiment.

FIG. 8 is a process flow diagram of a method 200 for producing a molded part having in-molded functional components 114 for a robotic device according to an exemplary embodiment. At block 202, the molded part 4 may be prepared by performing steps including providing a film, such as the first film 8 and/or the second film 14. At block 204, the method includes arranging a plurality of functional components 114 on the first film 8 and/or the second film 14. For example, the functional components 114 may be printed on the electronic circuit 12, including the communications antenna 26, on the first film 8 and/or the second film 14. The circuit 12 may be printed on the surface of the first film 8 and/or the second film 14 or otherwise applied to the first film 8 and/or the second film 14. In one aspect, the circuit 12 is printed on the film using a conductive ink. The film and the circuit 12 are then arranged in a mold to undergo a molding process to form the molded part 4.

At block 206, the method 200 include arranging the film (e.g., the first film 8 and/or the second film 14) and the functional components in a mold. If the circuit 12 is arranged on the first film 8 (FIGS. 3-4), then use of the second film 14 is not necessary to produce the molded part 4 since the first film 8 will support the circuit 12 during the molding process. However, if the second film 14 is being included in the molded part 4, then the second film 14 may also be arranged in the mold along with the first film 8 and the circuit 12. If the circuit 12 is arranged on the second film 14 however, then the first film 8 may also be arranged in the mold along with second film 14 and the circuit 12. If both the first film 8 and the second film 14 are being included in the molded part 4, then the circuit 12 may be arranged between the first film 8 and the second film 14. The first film 8 and the second film 14 and the circuit 12 may be flat before being arranged in the mold.

At block 208, a liquid resin material may then be injected into the mold and cured to form a solid polymer as the structural layer 10 to thereby form the molded part 4. The resin material may be a thermosetting polymer or a thermoplastic polymer. If the resin is a thermosetting polymer, the mold may be heated to cure the thermosetting polymer. If the resin is a thermoplastic polymer, then the resin may be heated to be in molten form prior to introduction into the mold. The heat from curing a thermoplastic polymer or from the molten thermosetting polymer may cause heating of the first film 8 and the second film 14 so that they are pliable. When at a pliable forming temperature, the first film 8 and the second film 14, may be conformed during the molding process to a desired contoured shape of an interior portion of the mold. Upon cooling of the cured solid polymer, the structural layer 10 is formed, and the thermoformed first film 8 and the second film 14 may retain a contoured shape, e.g. as depicted in FIG. 1. In this way, the mold determines the shape of the molded structural layer 10, which determines the shape of molded part 4. The first film 8 and the second film 14 may be thermoformed from a flat arrangement (e.g. FIG. 3) to have a contoured shape, such as that of the molded part 4. The cured polymer of the structural layer 10 may hold together the various other elements/layers of the molded part 4; and the structural layer 10 gives shape, form, and rigidity to the molded part 4.

The first film 8, second film 14, and the circuit 12 may be flat before being thermoformed in the molding process as depicted in FIGS. 3-5, and may be thermoformed during the molding process to have a contoured shape as shown in FIGS. 1-2. Although the various layers of the molded part 4 are shown to be flat in FIGS. 3-5, this is not necessary, and the various layers may be contoured as shown in FIGS. 1 and 2 to form the robotic device 2, such a robotic lawn mower. The resin may be injected into the mold such when it cures, the structural layer 10 is arranged adjacent the circuit 12, or such that one or more layers or materials separate the structural layer 10 from the circuit 12.

Although the subject matter has been described in language specific to structural features or methodological acts, it is to be understood that the subject matter of the appended claims is not necessarily limited to the specific features or acts described above. Rather, the specific features and acts described above are disclosed as example embodiments.

Various operations of embodiments are provided herein. The order in which one or more or all of the operations are described should not be construed as to imply that these operations are necessarily order dependent. Alternative ordering will be appreciated based on this description. Further, not all operations may necessarily be present in each embodiment provided herein.

As used in this application, "or" is intended to mean an inclusive "or" rather than an exclusive "or". Further, an inclusive "or" may include any combination thereof (e.g., A, B, or any combination thereof). In addition, "a" and "an" as used in this application are generally construed to mean "one or more" unless specified otherwise or clear from context to be directed to a singular form. Additionally, at least one of A and B and/or the like generally means A or B or both A and B. Further, to the extent that "includes", "having", "has", "with", or variants thereof are used in either the detailed description or the claims, such terms are intended to be inclusive in a manner similar to the term "comprising".

Further, unless specified otherwise, "first", "second", or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel. Additionally, "comprising", "comprises", "including", "includes", or the like generally means comprising or including, but not limited to.

It will be appreciated that various of the above-disclosed and other features and functions, or alternatives or varieties thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. A robotic device having functional component, the robotic device comprising: an electronic computing unit for controlling the robotic device; and a molded part that includes: a thermoformed first film; a molded structural layer arranged under the thermoformed first film; a thermoformed second film arranged under the molded structural layer; and an in-molded printed electronic circuit arranged over the thermoformed second film and adjacent the molded structural layer, the in-molded printed electronic circuit including a functional component communicably coupled to the electronic computing unit, wherein the thermoformed first film is arranged to cover the molded structural layer, the thermoformed second film, and the in-molded printed electronic circuit to define an exposed surface of the molded part; and the in-molded printed electronic circuit is arranged in a single layer on the thermoformed second film; and the in-molded printed electronic circuit further includes a light source that emits light; and the thermoformed first film is arranged over the light source, the light emitted by the light source is visible through the thermoformed first film; the light source is arranged in a U-shape in a top view including a first longitudinal portion, a center portion, and a second longitudinal portion that transition continuously without interruption; and each of the first longitudinal portion, the center portion, and the second longitudinal portion indicate different operational statuses.

2. The robotic device according to claim 1, wherein the electronic computing unit comprises a processor to cause a change to the functional components.

3. The robotic device according to claim 2, wherein the change is based on data from a device system.

4. A robotic device having functional component, the robotic device comprising: an electronic computing unit for controlling the robotic device; and a molded part that includes: a thermoformed first film; a molded structural layer arranged under the thermoformed first film; a thermoformed second film arranged under the molded structural layer; and an in-molded printed electronic circuit arranged over the thermoformed second film and adjacent the molded structural layer, the in-molded printed electronic circuit including a functional component communicably coupled to the electronic computing unit and a light source that emits light, wherein the thermoformed first film is arranged to cover the molded structural layer, the thermoformed second film, and the in-molded printed electronic circuit to define an exposed surface of the molded part; and the in-molded printed electronic circuit is arranged in a single layer on the thermoformed second film; and the in-molded printed electronic circuit further includes a light source that emits light; and the thermoformed first film is arranged over the light source, the light emitted by the light source is visible through the thermoformed first film; the light source is arranged in a U-shape in a top view including a first longitudinal portion, a center portion, and a second longitudinal portion that transition continuously without interruption; and each of the first longitudinal portion, the center portion, and the second longitudinal portion indicate different operational statuses.

5. A robotic device having functional component, the robotic device comprising: an electronic computing unit for controlling the robotic device; and a molded part that includes: a thermoformed first film; a molded structural layer arranged under the thermoformed first film; a thermoformed second film arranged under the molded structural layer; and an in-molded printed electronic circuit arranged over the thermoformed second film and adjacent the molded structural layer, the in-molded printed electronic circuit including a functional component communicably coupled to the electronic computing unit and a light source that emits light; and the thermoformed first film is arranged to cover the molded structural layer, the thermoformed second film, and the in-molded printed electronic circuit to define an exposed surface of the molded part; and the in-molded printed electronic circuit is arranged in a single layer on the thermoformed second film; and the in-molded printed electronic circuit further includes a light source that emits light; and the thermoformed first film is arranged over the light source, the light emitted by the light source is visible through the thermoformed first film; the light source is arranged in a U-shape in a top view including a first longitudinal portion, a center portion, and a second longitudinal portion that transition continuously without interruption; and each of the first longitudinal portion, the center portion, and the second longitudinal portion indicate different operational statuses.

* * * * *